United States Patent
Ding et al.

(10) Patent No.: US 11,751,477 B2
(45) Date of Patent: Sep. 5, 2023

(54) PIEZOELECTRIC FILM, PREPARATION METHOD THEREOF AND PIEZOELECTRIC FILM SENSOR

(71) Applicants: Interface Technology (ChengDu) Co., Ltd., Chengdu (CN); Interface Optoelectronics (Shenzhen) Co., Ltd., Shenzhen (CN); General Interface Solution Limited, Zhunan Township, Miaoli County (TW)

(72) Inventors: Huan Ding, Chengdu (CN); Weikun Lee, Chengdu (CN); Mengzhu Ma, Chengdu (CN)

(73) Assignees: Interface Technology (Chengdu) Co., Ltd., Chengdu (CN); Interface Optoelectronics (Shenzhen) Co., Ltd., Shenzhen (CN); General Interface Solution Limited, Zhunan Township (TW)

( * ) Notice: Subject to any disclaimer, the term of this patent is extended or adjusted under 35 U.S.C. 154(b) by 470 days.

(21) Appl. No.: 16/929,818

(22) Filed: Jul. 15, 2020

(65) Prior Publication Data
US 2021/0126188 A1    Apr. 29, 2021

(30) Foreign Application Priority Data
Oct. 25, 2019    (CN) .......................... 201911029090.6

(51) Int. Cl.
| | | |
|---|---|---|
| *H10N 30/045* | (2023.01) | |
| *H10N 30/30* | (2023.01) | |
| *H10N 30/857* | (2023.01) | |
| *H10N 30/078* | (2023.01) | |
| *H10N 30/098* | (2023.01) | |

(52) U.S. Cl.
CPC ........ *H10N 30/078* (2023.02); *H10N 30/045* (2023.02); *H10N 30/098* (2023.02); *H10N 30/302* (2023.02); *H10N 30/857* (2023.02)

(58) Field of Classification Search
CPC ... H01L 41/1132; H01L 41/193; H01L 41/257
See application file for complete search history.

(56) References Cited

U.S. PATENT DOCUMENTS

| | | | | |
|---|---|---|---|---|
| 4,578,442 | A | * 3/1986 | Ohigashi | ............... H01L 41/193 264/435 |
| 4,606,871 | A | * 8/1986 | Krueger | ............... H01L 41/193 264/435 |

(Continued)

FOREIGN PATENT DOCUMENTS

WO    WO-2017010135 A1 * 1/2017    ............... G01L 1/16

OTHER PUBLICATIONS

Kim et al., Journal of Materials Chemistry A, 2016, 4, pp. 756-763 (Year: 2016).*

*Primary Examiner* — Peter Dungba Vo
*Assistant Examiner* — Jose K Abraham
(74) *Attorney, Agent, or Firm* — Polsinelli PC

(57) ABSTRACT

A method for preparing a piezoelectric film includes: coating a solution containing a piezoelectric polymer and a solvent on a substrate to obtain a film, wherein the piezoelectric polymer is a copolymer of vinylidene fluoride and trifluoroethylene; and annealing the film at a temperature ranging from 122° C. to 133° C., to obtain the piezoelectric film.

13 Claims, 3 Drawing Sheets

(56) References Cited

U.S. PATENT DOCUMENTS

| | | | | | |
|---|---|---|---|---|---|
| 4,615,848 | A | * | 10/1986 | Krueger | H01L 41/45 |
| | | | | | 264/435 |
| 4,692,285 | A | * | 9/1987 | Bloomfield | H01L 41/257 |
| | | | | | 264/237 |
| 4,778,867 | A | * | 10/1988 | Preis | H01L 41/45 |
| | | | | | 526/255 |
| 4,784,915 | A | * | 11/1988 | Sakagami | H01L 41/45 |
| | | | | | 310/357 |
| 5,825,121 | A | * | 10/1998 | Shimada | H01L 41/43 |
| | | | | | 29/25.35 |
| 6,182,340 | B1 | * | 2/2001 | Bishop | H01L 41/107 |
| | | | | | 29/25.35 |
| 6,543,107 | B1 | * | 4/2003 | Miyashita | H01L 41/318 |
| | | | | | 29/25.35 |
| 2003/0032214 | A1 | * | 2/2003 | Huang | B29C 64/40 |
| | | | | | 264/435 |
| 2012/0025674 | A1 | * | 2/2012 | Yoshida | H01L 41/193 |
| | | | | | 310/365 |
| 2012/0132846 | A1 | * | 5/2012 | Yoshida | B29C 71/02 |
| | | | | | 252/62.9 R |
| 2013/0026021 | A1 | * | 1/2013 | Hori | H01H 49/00 |
| | | | | | 29/25.35 |
| 2014/0339724 | A1 | * | 11/2014 | Yoshida | B29C 71/0009 |
| | | | | | 252/62.9 R |
| 2015/0322220 | A1 | * | 11/2015 | Choi | B06B 1/0688 |
| | | | | | 156/306.6 |
| 2017/0033276 | A1 | * | 2/2017 | Kou | G06F 3/041 |
| 2018/0097171 | A1 | * | 4/2018 | Omote | H01L 41/317 |
| 2020/0119256 | A1 | * | 4/2020 | Chen | H10N 30/87 |

* cited by examiner

FIG. 4-a
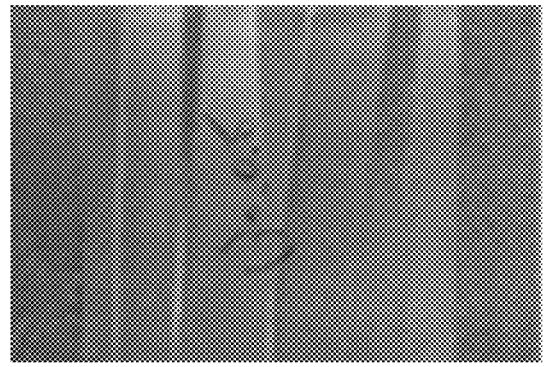
FIG. 4-b
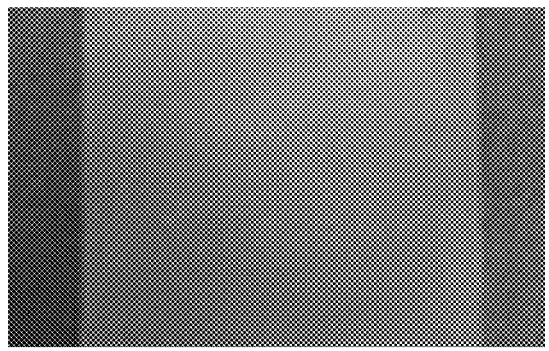
FIG. 5-a
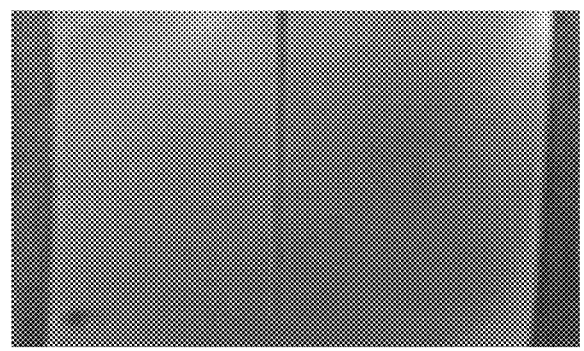
FIG. 5-b

PIEZOELECTRIC FILM, PREPARATION METHOD THEREOF AND PIEZOELECTRIC FILM SENSOR

CROSS-REFERENCE TO RELATED APPLICATION

This application claims the benefit of Chinese Patent Application No. 201911029090.6 filed on Oct. 25, 2019, the entire content of which is incorporated herein in its entirety.

TECHNICAL FIELD

The present disclosure relates to the field of piezoelectric film, in particular, to a method for preparing a piezoelectric film.

BACKGROUND

Due to an excellent piezoelectric performance, i.e., the film can generate corresponding charges after being pressed, PVDF (polyvinylidene fluoride) can be used to manufacture piezoelectric film sensors. Based on this principle, the piezoelectric film has a very broad application prospect. Many of the properties of PVDF are closely related to its crystal structure. The α crystal form is the most common crystalline form of PVDF, which can be converted to β-phase PVDF with strong piezoelectric effect after high temperature annealing and polarizing.

However, the PVDF piezoelectric film manufactured by a conventional method has a problem of being cracked easily, which cannot meet the flexibility required by a product.

Therefore, there is a need to provide a solution of a piezoelectric film with good piezoelectric performance and good flexibility.

SUMMARY

According to various embodiments, a method for preparing a piezoelectric film is provided.

A method for preparing a piezoelectric film includes coating a solution containing a piezoelectric polymer and a solvent on a substrate to obtain a film, wherein the piezoelectric polymer is a copolymer of vinylidene fluoride and trifluoroethylene; and annealing the film at a temperature ranging from 122° C. to 133° C., to obtain the piezoelectric film.

A piezoelectric film prepared by the aforementioned method is also provided, wherein an elongation rate at break of the piezoelectric film is greater than 15%, and a D33 value thereof is at least 30 pc/N.

A piezoelectric film sensor including the piezoelectric thin film is also provided.

These and other objects, advantages, purposes, and features will become apparent upon review of the following detailed description in conjunction with the drawings.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIGS. 4-a, and 4-b are comparative photographs of a piezoelectric film in example 1 before and after being subjected to a bending of 180°, respectively.

FIGS. 5-a, and 5-b are comparative photographs of a piezoelectric film in comparative example 2 before and after being subjected to a bending of 180°, respectively.

DETAILED DESCRIPTION OF THE EMBODIMENTS

Exemplary embodiments will be described hereafter with reference to the drawings to clearly and fully illustrate the technical solutions of the present disclosure. All other embodiments obtained by a person of ordinary skill in the art based on the embodiments in the present disclosure without creative efforts are within the scope of the present disclosure.

The following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
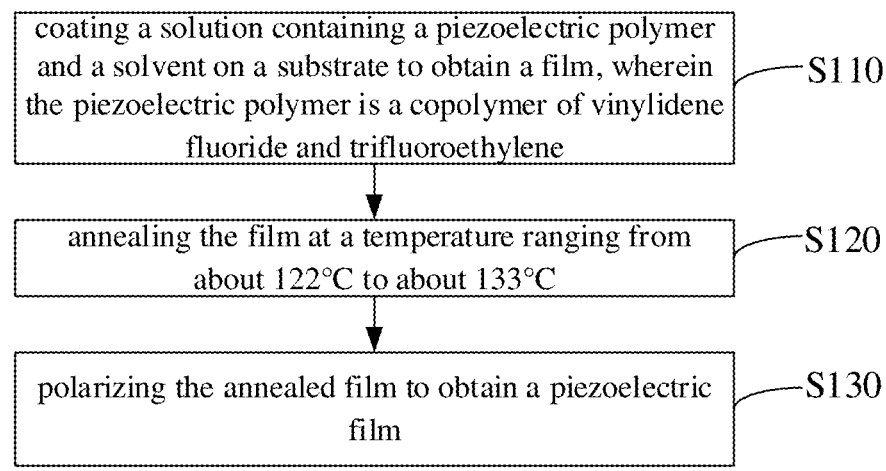
FIG. 1 is a flowchart of a method for preparing a piezoelectric film according to an embodiment.

Referring to FIG. 1, a method for preparing a piezoelectric film according to an embodiment includes the following steps:

In step S110, a solution containing a piezoelectric polymer and a solvent is coated on a substrate to obtain a film.

Specifically, in one of the embodiments, the piezoelectric polymer is a copolymer of the vinylidene fluoride and the trifluoroethylene (P(VDF-TrFE)).

After adding the trifluoroethylene to the vinylidene fluoride, since the diameter of each of fluorine atoms in the trifluoroethylene is slightly greater than the diameter of each of hydrogen atoms, after replacing the hydrogen atoms with the fluorine atoms, subjected to steric hindrance, the molecular structure of P(VDF-TrFE) is more inclined to the all-trans structure, such that the copolymer itself exhibits better piezoelectricity. Moreover, in the subsequent process of preparing the piezoelectric film, the piezoelectric film can have a good piezoelectric constant D33 value even without stretching. The piezoelectric constant D33 is a proportional coefficient of the piezoelectric film to convert mechanical energy (or electrical energy) into electrical energy (or mechanical energy), which reflects a relationship between stress or strain and electric field or electrical displacement, and can reflect the strength of piezoelectric characteristics. The higher the piezoelectric constant D33 value, the better the piezoelectric effect of the piezoelectric film can be obtained.

In one of the embodiments, a molar ratio of the vinylidene fluoride to the trifluoroethylene in the copolymer of vinylidene fluoride and trifluoroethylene is 80:20. It should be understood that, in other embodiments, the molar ratio of the vinylidene fluoride to the trifluoroethylene is not limited hereto.

The solvent can dissolve the piezoelectric polymer. In one of the embodiments, the solvent is at least one selected from the group consisting of N, N-dimethylacetamide (DMAc) and methyl ethyl ketone (MEK). It should be understood that, other solvents capable of dissolving the piezoelectric polymer may also be used.

In one of the embodiments, the substrate is an ITO glass. It should be understood that, in other embodiments, the substrate may also be a silicon substrate or quartz glass.

In one of the embodiments, the coating method in step S110 is slit coating. The slit coating has the characteristics of fast coating speed, good uniformity of coating film and wide coating range and the like, which can be used for coating large-size films. Moreover, the use of the slit coating can also reduce the amount of wastes generated. It can be understood that the coating method in step S110 is not limited to the slit coating, and may also be other coating method commonly used in the art.

In one of the embodiments, the film in step 110 has a thickness ranging from 37 μm to 43 μm.

In one of the embodiments, prior to step 110, the method further includes a step of mixing the piezoelectric polymer and the solvent to obtain the solution. In one of the embodiments, an ultrasonic vibration is used during the mixing.

In step S120, the film is annealed at a temperature ranging from 122° C. to 133° C.

The annealing can improve a crystallinity of the piezoelectric film. The film before the annealing has good elasticity and toughness, but after the conventional annealing, the film is prone to cracking, which cannot meet the flexibility required by the product. After a large number of experiments, it has been found that the cracking of the film was related to the change of the crystallization way of the film during the annealing. The annealing temperature is generally below a melting point of the film, which is 150° C. During the experiment, it has been found that the samples annealed at 140° C. are very brittle due to high temperature. However, the D33 value of the samples annealed at 120° C. may not meet the requirements. Therefore, in this embodiment, the annealing temperature may range from 122° C. to 133° C., and such annealing condition can simultaneously meet the D33 value representing the piezoelectric characteristic and elongation rate at break required by the piezoelectric film.

In one of the embodiments, the film is gradually annealed. For example, the annealing in step S120 may include at least a first annealing stage and a second annealing stage. A temperature of the first annealing stage is lower than a temperature of the second annealing stage, and the time of the first annealing stage is greater than the time of the second annealing stage.

Specifically, the temperature of the first annealing stage may range from 122° C. to 128° C., and the time of the first annealing stage may be less than or equal to one hour. Specifically, the time of the first annealing stage may be range from to 0.5 h to 1 h. Furthermore, the time of the first annealing stage may be 1 h. The temperature of the second annealing stage may be 130° C., and the time of the second annealing stage may be less than 20 minutes. Specifically, the time of the second annealing stage may be range from to 10 minutes to 20 minutes. Furthermore, the time of the second annealing stage may be 20 minutes.

According to the embodiment described above, the annealing can be performed with an increasing temperature step by step. The film is crystallized slowly and uniformly at lower temperature, and then the temperature is increased, such that the elongation rate at break of the obtained piezoelectric film can reach more than 100%, and the D33 value is at least 30 pc/N.

In one of the embodiments, step 210 is as follows: the film is annealed at one specific temperature selected in the range from 127° C. to 133° C. throughout the process for 0.5 h to 4.0 h. Specifically, the annealing temperature may be 130° C., and the annealing time may be 0.5 h.

After a large number of experiments, it has been found that, the piezoelectric film obtained by annealing at the temperature lower than 127° C. throughout the whole process exhibits a lower D33 value, while the piezoelectric film obtained by the annealing at the temperature higher than 133° C. throughout the whole process is prone to cracking. Therefore, in this embodiment, a specific temperature between 127° C. to 133° C. is selected throughout the whole process of annealing, the obtained piezoelectric film may have an elongation rate at break greater than 15%, which meets the requirement for flexibility, and the D33 value is maintained at 30 pc/N. In one embodiment, the specific temperature is 130° C.

Optionally, the method further includes step 130: polarizing the annealed piezoelectric film.

Specifically, a polarization electric field during the polarization of the annealed piezoelectric film may range from 5 kV to 10 kV. The polarization time may be greater than or equal to 5 minutes. The polarizing temperature may be a room temperature. The purpose of the polarization is to highly orient the β-phase PVDF, thereby improving the piezoelectricity and ferroelectricity of the piezoelectric film.

The method for preparing the piezoelectric film has at least the following advantages:

(1) The piezoelectric film obtained by this method has a D33 value of 30 pc/N, an elongation rate at break greater than 15%, which meets the requirement for flexibility. Therefore, according to the method described above, a piezoelectric film having better piezoelectric performance and flexibility can be obtained.

(2) The method for preparing the piezoelectric film has a simple process, and the piezoelectric film having better piezoelectric performance and good flexibility can be obtained without stretching, which reduces the operation steps, and is easy for industrial production.

In one of the embodiments, the solution containing the piezoelectric polymer and the solvent further includes a plasticizer.

The plasticizer is functional additive that gives flexibility and processability to a polymer product. Adding the plasticizer can overcome the cracking problem of the piezoelectric film. Specifically, the plasticizer is a phthalate-based plasticizer. Due to a wide applicability and low cost, the phthalate-based plasticizer accounts for more than 70% of the total plasticizer production and consumption. In one of the examples, the plasticizer is at least one selected from the group consisting of dibutyl phthalate (DBP), dioctyl phthalate (DOP), and diethyl phthalate (DEP). Furthermore, the plasticizer is DBP.

As a plasticizer, DBP is added to the solution containing the piezoelectric polymer and the solvent with different ratios, and the films are obtained according to the method of the above embodiment. The stress-strain properties of the films when the plasticizers with different ratios being added are studied, and the stress-strain curves of the films obtained when the plasticizers are added in different ratios are shown in FIG. 2.

Figure 2:
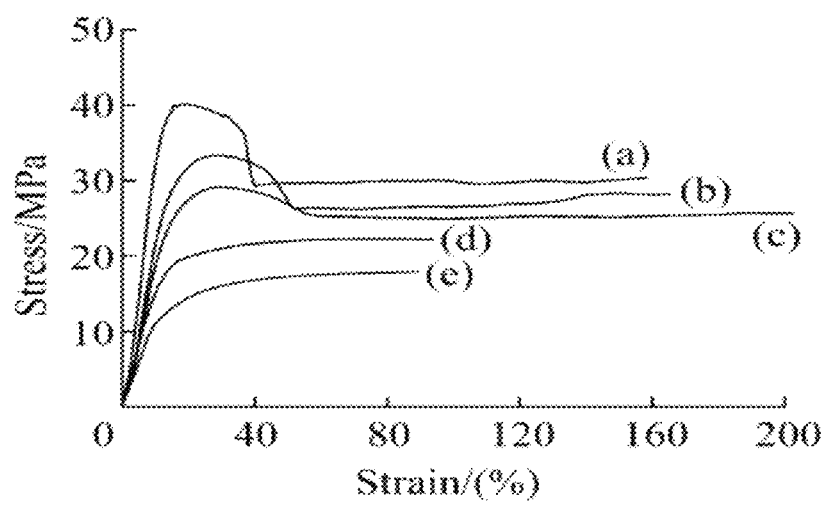
FIG. 2 illustrates stress-strain curves of films when plasticizers are added in different ratios.

In FIG. 2, curve a, curve b, curve c, curve d and curve e correspond to the stress-strain curves when the DBP is added in amounts of 0 wt %, 5 wt %, 10 wt %, 20 wt % and 30 wt %, respectively. It can be seen from FIG. 2 that, when the DBP is added in an amount of 10 wt %, the elongation rate at break of the film reaches to the maximum value (202%). This indicates that adding the DBP in the amount of 10 wt % can improve the elongation at break of the film, improve the usability of the film, and be beneficial to improve the flexibility and processability of the film.

According to one embodiment, a piezoelectric film is obtained by the method for preparing the piezoelectric film of the above examples. The piezoelectric film has an elongation rate at break greater than 15%, which is not easy to cracking, and has a D33 value of at least 30 pc/N, which leads to a better piezoelectric performance. Therefore, the piezoelectric film can be used in a piezoelectric film sensor.

In one of the embodiments, a piezoelectric film sensor including the piezoelectric film of the above embodiments is also provided.

The detailed descriptions of examples are as follows:

Example 1

A process of preparing a piezoelectric film was as follows:
(1) A solution containing DMAc and a copolymer of vinylidene fluoride and trifluoroethylene was coated on an ITO glass to obtain a film.
(2) The film was annealed at 130° C. for 0.5 h, and the annealed film was then polarized at room temperature to obtain a piezoelectric film, where the polarization electric field was 5 kV and the polarization time was 10 minutes.

Example 2

A process of preparing a piezoelectric film was as follows:
(1) A solution containing DMAc and a copolymer of vinylidene fluoride and trifluoroethylene was coated on an ITO glass to obtain a film.
(2) A first annealing stage was performed to the film at 125° C. for 1 h, and then, a second annealing stage was performed at 130° C. for 20 minutes, and then, the annealed film was polarized at room temperature to obtain a piezoelectric film, where the polarization electric field was 8 kV and the polarization time was 15 minutes.

Example 3

A process of preparing a piezoelectric film was as follows:
(1) A solution containing DMAc and a copolymer of vinylidene fluoride and trifluoroethylene was coated on an ITO glass to obtain a film.
(2) A first annealing stage was performed to the film at 122° C. for 1 h, and then, a second annealing stage was performed at 130° C. for 16 minutes, and then, the annealed film was polarized at room temperature to obtain a piezoelectric film, where the polarization electric field was 10 kV and the polarization time was 15 minutes.

Example 4

A process of preparing a piezoelectric film was as follows:
(1) A solution containing DMAc and a copolymer of vinylidene fluoride and trifluoroethylene was coated on an ITO glass to obtain a film.
(2) A first annealing stage was performed on the film at 128° C. for 1 h, and then, a second annealing stage was performed to the film at 130° C. for 20 minutes, and then, the annealed film was polarized at room temperature to obtain a piezoelectric film, where the polarization electric field was 5 kV and the polarization time was 20 minutes.

Example 5

A process of preparing a piezoelectric film was as follows:
(1) A copolymer of vinylidene fluoride and trifluoroethylene was mixed with MEK solution, and the resulted solution was coated on an ITO glass to obtain a film.
(2) The film is annealed at 133° C. for 2 h, and then, the annealed film was polarized at room temperature to obtain a piezoelectric film, where the polarization electric field was 10 kV and the polarization time was 5 minutes.

Example 6

A process of preparing a piezoelectric film was as follows:
(1) A copolymer of vinylidene fluoride and trifluoroethylene was mixed with MEK solution, and the resulted solution was coated on an ITO glass to obtain a film.
(2) The film is annealed at 128° C. for 4 h, and then, the annealed film is polarized at room temperature to obtain a piezoelectric film, where the polarization electric field was 10 kV and the polarization time was 5 minutes.

Comparative Example 1

A process of preparing a piezoelectric film of the comparative example 1 was similar to that of the example 1, except that: in step (2), the annealing temperature was 120° C.

Comparative Example 2

A process of preparing a piezoelectric film of the comparative example 2 was similar to that of the example 1, except that: in step (2), the annealing temperature was 140° C.

Figure 3:
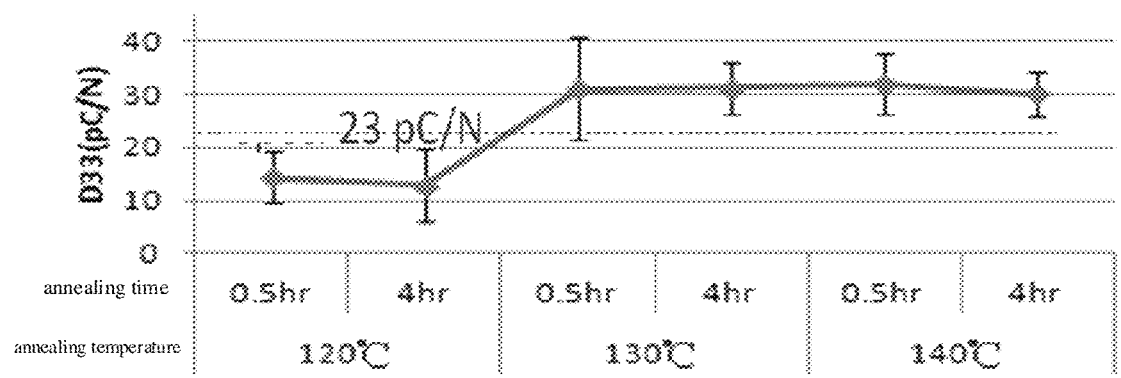
FIG. 3 illustrates relationship between a value of D33 and annealing conditions obtained through an example 1, a comparative example 1 and a comparative example 2.

A Piezotest PM300 D33 tester was used to test the D33 values of the piezoelectric film obtained in Example 1 and the piezoelectric films obtained in Comparative Example 1 and Comparative Example 2. During the test, the settings were 0.25N, 1 kHz, and in no preload control mode, the results are as shown in FIG. 3. It can be seen from FIG. 3 that the piezoelectric film had a good D33 value when the annealing temperature was greater than 120° C., and a higher temperature had little effect on the D33 value.

In addition, the annealing time of Example 1, Comparative example 1, and Comparative example 1 was adjusted, and the effects of the annealing time on the D33 value were also recorded in FIG. 3. It can also be seen from FIG. 3 that the annealing time had little effect on the D33 value. The D33 value of the piezoelectric film when the annealing time was 0.5 h was higher than that of the piezoelectric film when the annealing time was 4 h.

FIGS. 4-*a*, and 4-*b* are comparative photographs of the piezoelectric film in Example 1 prior to and after being subjected to a bending of 180°, respectively. FIGS. 5-*a*, and 5-*b* are comparative photographs of the piezoelectric film after the annealing time is adjusted to 4 h in the comparative example 2, before and after being subjected to a bending of 180°, respectively. It can be seen from FIGS. 4-*a*, and 4-*b* that the piezoelectric film obtained when the annealing was performed at 130° C. for 0.5 h was not cracked when subjected to a bending of 180°, while it can be seen from FIGS. 5-*a*, and 5-*b* that the piezoelectric film obtained when the annealing was performed at 140° C. for 4 h was significantly cracked when subjected to a bending of 180°.

Therefore, it can be seen from FIGS. 3, 4-*a*, 4-*b*, 5-*a* and 5-*b*, the piezoelectric film obtained when the annealing temperature was 140° C. had better piezoelectric performance and flexibility than the piezoelectric film obtained when the annealing temperatures were 120° C. and 140° C., respectively.

It can be seen from the experiment results that changing the annealing conditions can improve the flexibility of the piezoelectric film and obtain better piezoelectric performance. Therefore, in this description, changing the annealing conditions is chosen to solve the problem of poor flexibility of the piezoelectric film.

Each technical features of the above embodiments can be arbitrarily combined. For simplifying the description, all possible combinations of each technical features in the embodiments are not described. However, as long as there is no contradiction in the combination of these technical features, they should be fallen within the scope of this description.

Only several embodiments of the present disclosure are illustrated in the embodiments, and descriptions thereof are more specific and detailed, but they should not be construed as limiting the scope of the disclosure. It should be noted that, for those skilled in the art, several modifications and improvements can be made without departing from the concept of the present disclosure, which all fall within the protection scope of the present disclosure. Therefore, the protection scope of the disclosure shall be subject to the appended claims.

What is claimed is:

1. A method for preparing a piezoelectric film, comprising:
    coating a solution containing a piezoelectric polymer and a solvent on a substrate to form a film, wherein the piezoelectric polymer is a copolymer of vinylidene fluoride and trifluoroethylene; and
    annealing the film at a temperature ranging from 122° C. to 133° C. to form the piezoelectric film;
    wherein the annealing comprises a first annealing stage followed by a second annealing stage, the temperature of the first annealing stage ranges from 122° C. to 128° C., the time of the first annealing stage is one hour and the temperature of the second annealing stage is 130° C., and the time of the second annealing stage is 20 minutes.

2. The method of claim 1, further comprising: polarizing the annealed piezoelectric film.

3. The method according to claim 2, wherein during the polarization of the annealed piezoelectric film, a polarization electric field ranges from 5 kV to 10 kV, and a polarization time is greater than or equal to 5 minutes is applied.

4. The method of claim 1, wherein the film has a thickness ranging from 37 μm to 43 μm.

5. The method of claim 1, wherein in the copolymer of vinylidene fluoride and trifluoroethylene, a molar ratio of the vinylidene fluoride to the trifluoroethylene 80:20 is selected.

6. The method of claim 1, wherein the solvent is at least one selected from a group consisting of N, N-dimethylacetamide and methyl ethyl ketone.

7. The method of claim 1, wherein the solution containing the piezoelectric polymer and the solvent further comprises a plasticizer having a concentration of less than or equal to 10 wt % in the solution.

8. The method of claim 7, wherein the plasticizer is at least one selected from a group consisting of dibutyl phthalate (DBP), dioctyl phthalate (DOP), and diethyl phthalate (DEP).

9. The method of claim 1, wherein the solution containing the piezoelectric polymer and the solvent is coated on the substrate by a slit coating method.

10. The method of claim 1, wherein the substrate is an ITO glass, a silicon substrate or quartz glass.

11. A piezoelectric film prepared by the method of claim 1, wherein an elongation rate at break of the piezoelectric film is greater than 15%, and a D33 value thereof is at least 30 pc/N.

12. The piezoelectric film of claim 11, wherein in the copolymer of vinylidene fluoride and trifluoroethylene, a molar ratio of the vinylidene fluoride to the trifluoroethylene 80:20 is selected.

13. A piezoelectric film sensor comprising the piezoelectric film of claim 11.

* * * * *